United States Patent
Matsunaga

(10) Patent No.: US 11,251,291 B2
(45) Date of Patent: Feb. 15, 2022

(54) SILICON CARBIDE SEMICONDUCTOR DEVICE

(71) Applicant: FUJI ELECTRIC CO., LTD., Kawasaki (JP)

(72) Inventor: Shinichiro Matsunaga, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/951,853

(22) Filed: Nov. 18, 2020

(65) Prior Publication Data
US 2021/0167196 A1 Jun. 3, 2021

(30) Foreign Application Priority Data
Dec. 2, 2019 (JP) .............................. JP2019-218350

(51) Int. Cl.
*H01L 29/739* (2006.01)
*H01L 29/74* (2006.01)
*H01L 29/16* (2006.01)

(52) U.S. Cl.
CPC ...... *H01L 29/7404* (2013.01); *H01L 29/1608* (2013.01); *H01L 29/7395* (2013.01)

(58) Field of Classification Search
CPC ............... H01L 29/0847; H01L 29/102; H01L 29/1095; H01L 29/1608; H01L 29/66068;
(Continued)

(56) References Cited

U.S. PATENT DOCUMENTS 4,760,431 A * 7/1988 Nakagawa .......... H01L 29/7428
257/138
5,105,244 A * 4/1992 Bauer .................. H01L 29/0834
257/133
(Continued)

FOREIGN PATENT DOCUMENTS

JP H07-273312 A 10/1995
JP H10-256529 A 9/1998

OTHER PUBLICATIONS

S. Matsunaga et al., "Low Von 17kV SiC IGBT assisted n-MOS Thyristor," 2019 IEEE International Electron Devices Meeting (IEDM ), 2019, pp. 20.2.1-20.2.4 (Year: 2019).*
(Continued)

*Primary Examiner* — Eric A. Ward
(74) *Attorney, Agent, or Firm* — Rabin & Berdo, P.C.

(57) ABSTRACT

A silicon carbide semiconductor device includes first semiconductor areas and second semiconductor areas. The first semiconductor areas have a first semiconductor layer of a second conductivity type, a second semiconductor layer of a first conductivity type, first semiconductor regions of the second conductivity type, second semiconductor regions of the first conductivity type, gate electrodes, and first electrodes. The second semiconductor areas have the first semiconductor layer, the second semiconductor layer, third semiconductor regions of the second conductivity type, the gate electrodes, and the first electrodes. The first semiconductor regions include low- impurity-concentration regions and high-impurity-concentration regions. The third semiconductor regions have a potential equal to that of the first electrodes. The first semiconductor regions are connected to the third semiconductor regions by MOS structures. In the first semiconductor regions, the high-impurity-concentration
(Continued)

regions are provided at positions different from positions facing the first electrodes.

8 Claims, 12 Drawing Sheets

(58) Field of Classification Search
CPC ......... H01L 29/7395; H01L 29/74–749; H01L 29/7404; H01L 29/742; H01L 29/7827; H01L 21/02529; H01L 21/02378
See application file for complete search history.

(56) References Cited

U.S. PATENT DOCUMENTS 5,644,150 A     7/1997   Iwamuro
5,914,503 A *   6/1999   Iwamuro ............. H01L 29/7455
                                                                  257/133

OTHER PUBLICATIONS

The Institute of Electrical Engineers of Japan, "Power Device/Power IC Handbook," Corona Publishing Co., Ltd., pp. 381-388, 1996.

* cited by examiner

SILICON CARBIDE SEMICONDUCTOR DEVICE

CROSS REFERENCE TO RELATED APPLICATIONS

This application is based upon and claims the benefit of priority of the prior Japanese Patent Application No. 2019-218350, filed on Dec. 2, 2019, the entire contents of which are incorporated herein by reference.

BACKGROUND OF THE INVENTION

1. Field of the Invention

Embodiments of the invention relate to a silicon carbide semiconductor device.

2. Description of the Related Art

Single crystal silicon (Si) is used as a material for power semiconductor devices that control high voltage and/or large current. There are several types of power semiconductor devices and these devices are selectively used according to an intended purpose. For example, P-intrinsic-N diodes (PiN diodes), bipolar transistors, and insulated gate bipolar transistors (IGBTs) are so-called bipolar devices. These devices have high current density but cannot be switched at high speeds and while the frequency is about several kHz for bipolar transistors, about 20 kHz is the usage limit for IGBTs. On the other hand, power metal oxide semiconductor field effect transistors (power MOSFETs) have low current density but can be switched at high speeds up to about several MHz. Nonetheless, there is a strong demand in the market for large-current, high-speed power semiconductor devices, Thus, with a focus on improving silicon IGBTs and power MOSFETs, development has substantially reached the theoretical limit determined by the material.

Further, materials have also been examined from the viewpoint of power semiconductor devices and silicon carbide (SiC) has been focused on as a semiconductor material for devices having low ON voltage, high-speed characteristics, and high-temperature characteristics as next-generation power semiconductor devices. One reason for this is that, for example, SiC is a very stable material chemically, has a wide bandgap of 3 eV, and can be used very stably as a semiconductor material even at high temperatures; SiC further has a critical electric field strength that is at least ten times that of silicon. SiC significantly has the potential to exceed the material limits of silicon and therefore, future grow in power semiconductor applications is expected. In particular, for ultra high voltage applications such as pulsed power and power exceeding withstand voltage of 10 kV, expectations for PiN diodes, which are bipolar devices, is high.

FIG. 14 is a cross-sectional view of a structure of a conventional SiC vertical IGBT. FIG. 14 depicts an n-channel silicon carbide IGBT 150. The n-channel silicon carbide IGBT 150 depicted in FIG. 14 is configured using a silicon carbide base in which a $p^{++}$-type collector layer 101 and an $n^-$-type drift layer 103 are sequentially stacked. In the $n^-$-type drift layer 103, p-type base regions 106 are provided. Further, in the p-type base regions 106, $n^+$-type emitter regions 108 and $p^+$-type collector regions 107 are provided.

Further, spanning surfaces of the p-type base regions 106 and the $n^-$-type drift layer 103, gate insulating films 109 are provided. On surfaces of the gate insulating films 109, gate electrodes 110 are provided and an interlayer insulating film 111 is provided so as to cover the gate electrodes 110. On a front surface of the silicon carbide base, emitter electrodes 112' are provided in contact with the $n^+$-type emitter regions 108 and the $p^+$-type collector regions 107, electrode wiring 113 is provided on the emitter electrodes 112', and a protective film (not depicted) is provided on the electrode wiring 113. Further, on a back surface, a collector electrode (not depicted) is provided.

In the n-channel silicon carbide IGBT 150, the emitter electrodes 112' and the $n^-$-type drift layer 103 that is a drift region are connected by a MOS gate structure that uses the gate electrodes 110 on the gate insulating films 109. By increasing the gate potential of the gate electrodes 110 and connecting the emitter electrodes 112' and the $n^-$-type drift layer 103 by channels, the potential of the $n^-$-type drift layer 103 becomes equal to an emitter potential and voltage is applied to the collector electrode. As a result, forward voltage is applied to the collector electrode and the $n^-$-type drift layer 103, whereby the IGBT turns on.

A MOS controlled thyristor (MCT) that can be turned on and turned off by a MOS gate structure is commonly known (for example, refer to The Institute of Electrical Engineers of Japan, "Power Device/Power IC Handbook", Corona Publishing Co., Ltd., pp. 381-388, 1996). FIG. 15 is a cross-sectional view of a structure of a conventional Si MCT. In an MCT 151, n-type base regions 114 are provided in the p-type base regions 106, whereby two MOSFETs respectively having an n-channel and a p-channel are built therein. On- and off-operations may be performed by these two MOSFETs. In the MCT 151, a cathode electrode 112 is provided at a front surface thereof, an anode electrode 116 is provided at a back surface of the MCT 151, and components identical to those in the n-channel silicon carbide IGBT 150 are assigned the same reference characters used for the n-channel silicon carbide IGBT 150.

In an instance of the structure depicted in FIG. 15, by causing the n-channel MOSFET to operate, electrons flow in from the cathode electrode 112 and holes are injected from the anode electrode 116, whereby a npnp region implements thyristor operation. Meanwhile, off-operation is realized by causing the p-channel MOSFET to operate, whereby the $n^+$-type emitter regions 108 are short-circuited with the p-type base regions 106 and the injection of electrons from the $n^+$-type emitter regions 108 is terminated.

SUMMARY OF THE INVENTION

According to an embodiment of the invention, a silicon carbide semiconductor device includes a plurality of first semiconductor areas; and a plurality of second semiconductor areas disposed adjacent to and alternating with the first semiconductor areas. The first semiconductor areas have: a first semiconductor layer of a second conductivity type, having opposite first and second main surfaces; a second semiconductor layer of a first conductivity type, provided on the first main surface of the first semiconductor layer, the second semiconductor layer having opposite first and second surfaces, the second surface facing the first semiconductor layer; a plurality of first semiconductor regions of the second conductivity type, selectively provided in a surface layer of the second semiconductor layer, at a first surface side of the second semiconductor layer, the first semiconductor regions having opposite first and second surfaces, the second surfaces of the first semiconductor regions facing the first semiconductor layer; a plurality of second semiconductor regions of the first conductivity type, selectively provided in surface layers of the first semiconductor regions, at first surface sides of the first semiconductor regions, the second semiconductor regions having an impurity concentration higher than an impurity concentration of the second semiconductor layer; a plurality of gate insulating films, provided on the first surfaces of the first semiconductor regions and the first surface of the second semiconductor layer; a plurality of gate electrodes provided on the gate insulating films; and a plurality of first electrodes electrically connected to the second semiconductor regions. The second semiconductor areas have: the first semiconductor layer; the second semiconductor layer; a plurality of third semiconductor regions of the second conductivity type, selectively provided in the surface layer of the second semiconductor layer, at the first surface side of the second semiconductor layer, the third semiconductor regions having opposite first and second surfaces, the second surfaces of the third semiconductor regions facing the first semiconductor layer; the gate insulating films provided on the first surfaces of the third semiconductor regions and the second semiconductor layer; the gate electrodes; and a plurality of second electrodes electrically connected to the third semiconductor regions. The first semiconductor regions respectively include a corresponding one of a plurality of low-impurity-concentration regions provided in the surface layer of the second semiconductor layer and a corresponding one of plurality of high-impurity-concentration regions, the plurality of high-impurity-concentration regions being provided closer to the first semiconductor layer than are the low-impurity-concentration regions, respectively. The third semiconductor regions have a potential equal to a potential of the first electrodes. The first semiconductor regions are connected to the third semiconductor regions by MOS structures. The high-impurity-concentration regions are provided at positions different from positions facing the first electrodes in a depth direction of the semiconductor device.

In the embodiment, the second semiconductor areas have a plurality of fourth semiconductor regions of the first conductivity type, selectively provided in surface layers of the third semiconductor regions, at first surface sides of the third semiconductor regions, the fourth semiconductor regions having an impurity concentration higher than the impurity concentration of the second semiconductor layer. The second electrodes are in contact with the third semiconductor regions and the fourth semiconductor regions.

In the embodiment, the second semiconductor areas have a plurality of fifth semiconductor regions of the second conductivity type, selectively provided in the surface layers of the third semiconductor regions, the fifth semiconductor regions having an impurity concentration higher than the impurity concentration of the third semiconductor regions. The second electrodes are electrically connected to the fifth semiconductor regions.

In the embodiment, the second semiconductor areas have a plurality of sixth semiconductor regions of the first conductivity type, provided in the surface layer of the second semiconductor layer, the sixth semiconductor regions being surrounded by the first semiconductor regions of the first semiconductor areas and having opposite first and second surfaces, the second surfaces facing the first semiconductor layer. The third semiconductor regions are selectively provided in surface layers of the sixth semiconductor regions, at first surface sides of the sixth semiconductor regions. The second electrodes are electrically connected to the sixth semiconductor regions and the third semiconductor regions. The gate insulating films are provided on the first surfaces of the sixth semiconductor regions and the third semiconductor regions.

In the embodiment, the sixth semiconductor regions have an impurity concentration higher than the impurity concentration of the second semiconductor layer.

In the embodiment, the silicon carbide semiconductor device further includes a plurality of seventh semiconductor regions of the second conductivity type, provided in the sixth semiconductor regions, in regions thereof free of the third semiconductor regions.

In the embodiment, in the first semiconductor regions, regions free of the high-impurity-concentration regions each have a width equal to a thickness of the first semiconductor regions.

In the embodiment, the gate electrodes of the first semiconductor areas have a potential equal to a potential of the gate electrodes of the second semiconductor areas.

Objects, features, and advantages of the present invention are specifically set forth in or will become apparent from the following detailed description of the invention when read in conjunction with the accompanying drawings.

DETAILED DESCRIPTION OF THE INVENTION

Figure 14:
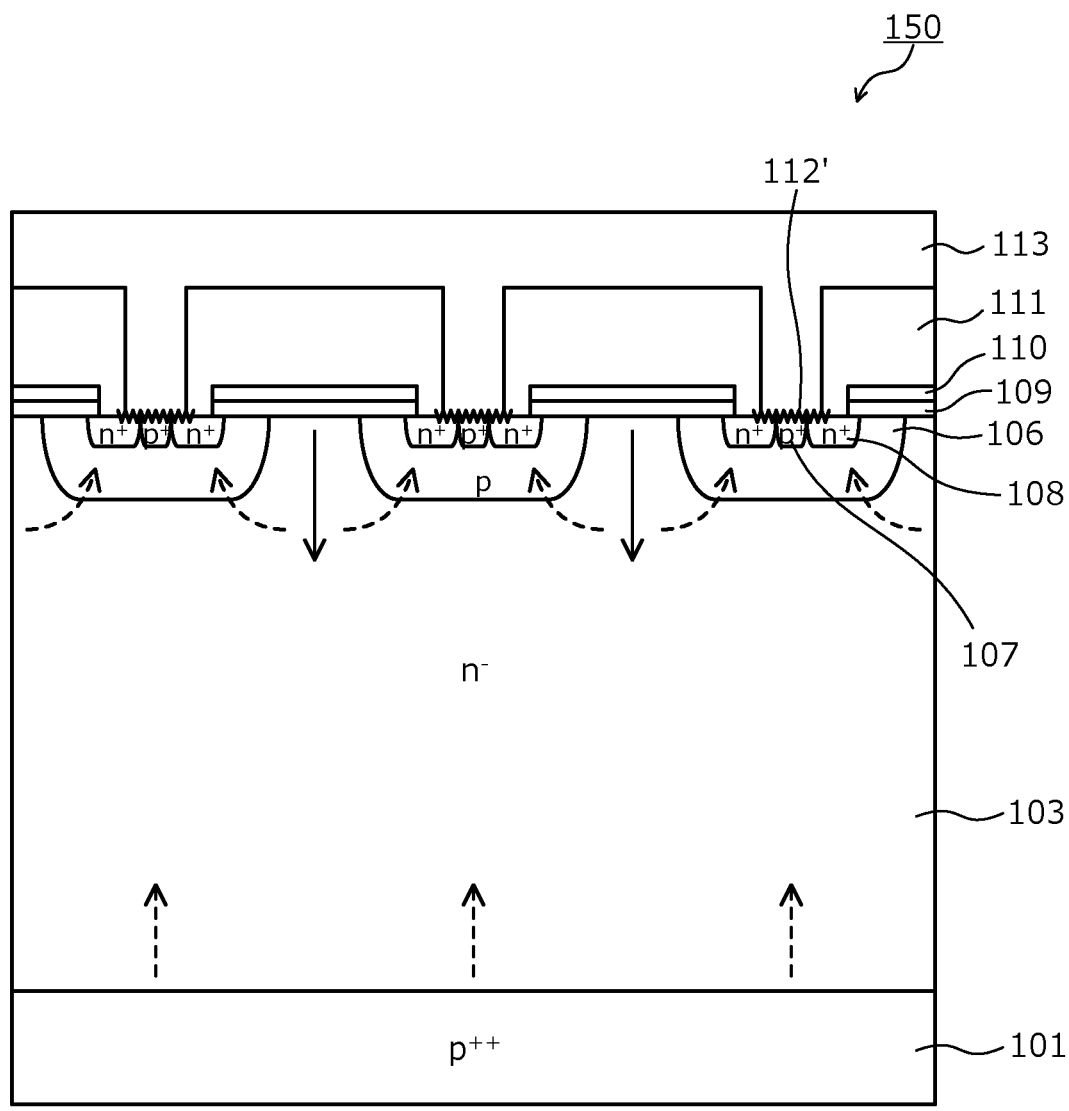
FIG. 14 is a cross-sectional view of a structure of a conventional SiC vertical IGBT.

In FIG. 14, solid lined arrows indicate the flow of electron current while dash lined arrows indicate the flow of hole current. As depicted by the dash lined arrows in FIG. 14, in the vertical SiC IGBT 150, holes injected from the collector electrode of the back surface go out through the p-type base regions 106 near the surface, whereby a problem arises in that the stored amount of minority carriers decreases and ON resistance does not decrease.

In the Si p-channel type IGBT, the p-type base regions are made narrower, whereby hole-passage is reduced and by the trench structure, the region of the p-type base regions is reduced, thereby enabling the stored amount of holes to be increased. Nonetheless, when a similar structure is attempted with SiC, high-concentration p-type regions are not present and therefore, high electric field is applied to oxide films (in particular, the gate insulating films 109), whereby destruction of the gate insulating films 109 occurs and reliability of the gate insulating films 109 decreases. Further, with SiC, channel mobility is low and therefore, when MOS structures, which are near the surface, are extremely small, the ON resistance is rate-limited by the channel resistance.

Figure 15:
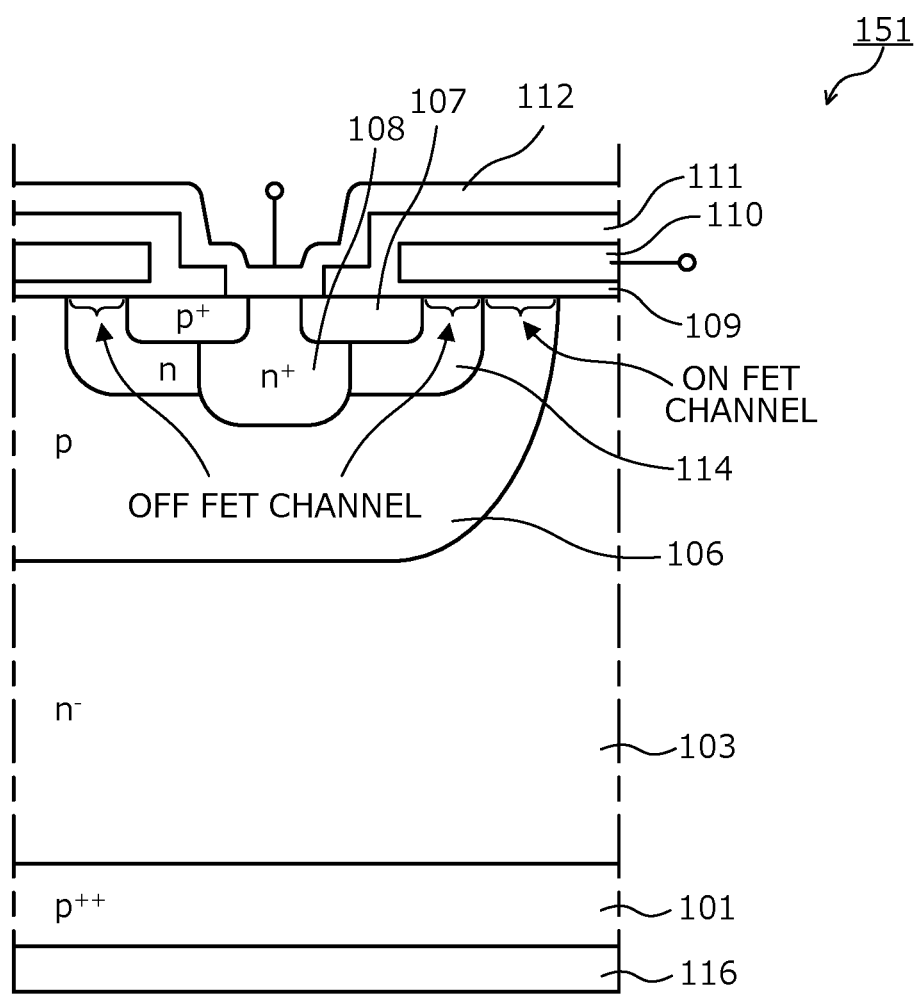
FIG. 15 is a cross-sectional view of a structure of a conventional Si MCT.

Further, the structure of the MCT 151 depicted in FIG. 15 enables hole-passage to be reduced. However, while the MOS structures of the surface of the MCT 151 have to be formed by ion implantation, for the most part, impurities do not thermally diffuse in SiC and therefore, deep formation of the p-type base regions 106 is difficult and formation of the MCT 151 in FIG. 15 is difficult with SiC.

Embodiments of a silicon carbide semiconductor device according to the present invention is described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Instances where symbols such as n's and p's that include + or − are the same indicate that concentrations are close and therefore, the concentrations are not necessarily equal. In the description of the embodiments below and the accompanying drawings, main portions that are identical are given the same reference numerals and are not repeatedly described.

Figure 1:
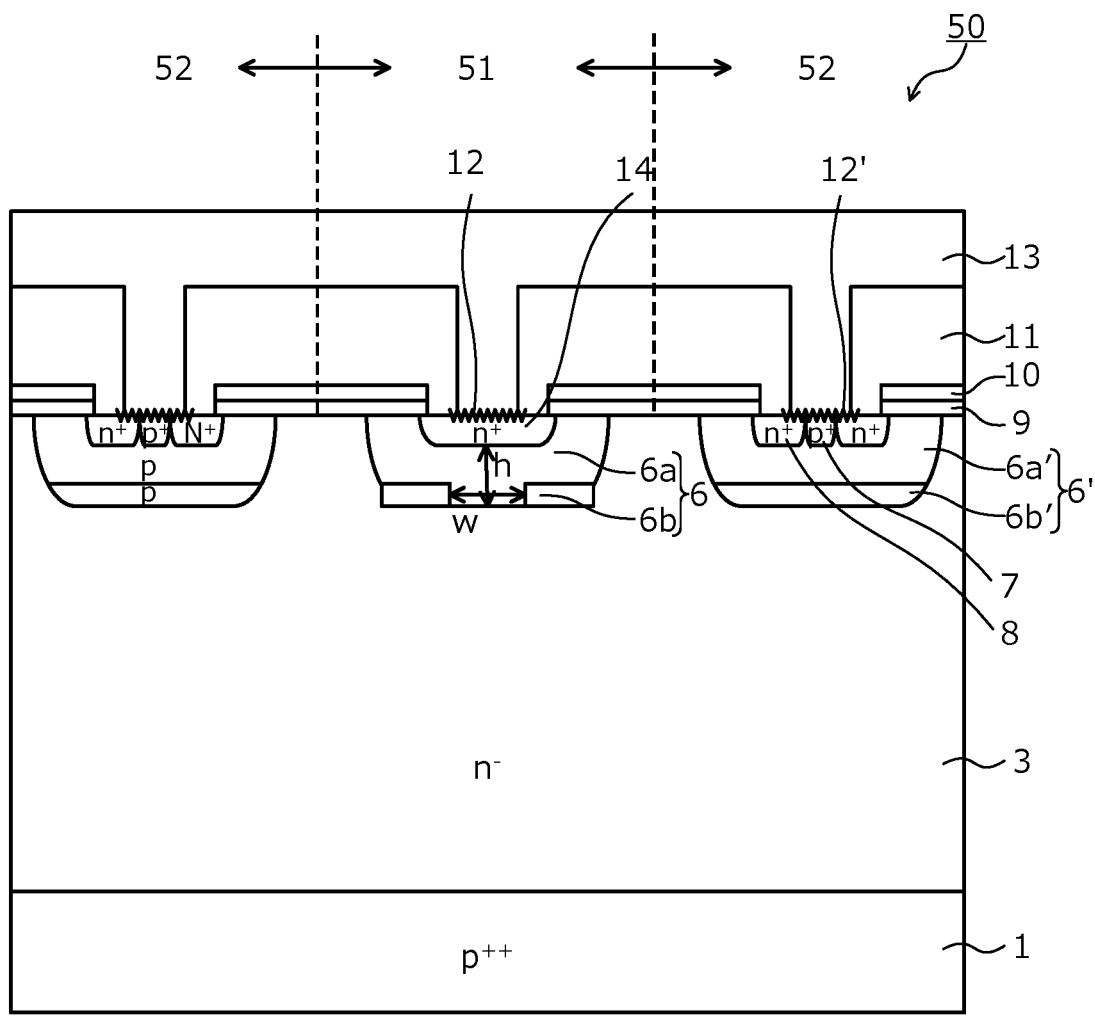
FIG. 1 is a cross-sectional view of a structure of a silicon carbide semiconductor device according to a first embodiment.

A silicon carbide semiconductor device 50 that uses a MOS thyristor structure is described as an example of a silicon carbide semiconductor device according to a first embodiment. FIG. 1 is a cross-sectional view of a structure of the silicon carbide semiconductor device according to the first embodiment.

As depicted in FIG. 1, in the silicon carbide semiconductor device 50, thyristor regions (first semiconductor areas) 51 and IGBT regions (second semiconductor areas) 52 are provided in parallel, adjacent to one another. The thyristor regions 51 are regions different from regions in which p-type regions are provided to fix the potential and later-described cathode electrodes 12 to the p-type base regions 6 described hereinafter. The IGBT regions 52 are regions in which p-type regions for fixing the potential and emitter electrodes 12' to p-type base regions 6'.

The silicon carbide semiconductor device 50 is configured using a silicon carbide base in which an n$^-$-type drift layer (second semiconductor layer of a first conductivity type) 3 is stacked sequentially on a front surface of a p$^{++}$-type collector layer (first semiconductor layer of a second conductivity type) 1. In the n$^-$-type drift layer 3, at the surface thereof, the p-type base regions (first semiconductor regions of the second conductivity type) 6 and the p-type base regions (third semiconductor regions of the second conductivity type) 6' are selectively provided.

Between the p$^{++}$-type collector layer 1 and the n$^-$-type drift layer 3, an n-type field stopper (FS) layer may be provided. The n-type FS layer is a layer provided having an impurity concentration higher than that of the n$^-$-type drift layer 3. During an off state, a depletion layer that spreads in the n$^-$-type drift layer 3, which has a high resistance, is suppressed by the n-type FS layer, thereby enabling punch-through to be prevented even when the n$^-$-type drift layer 3 is thin. The n-type FS layer may be a single layer or may be multiple layers and in an instance of multiple layers, may be multiple layers of similar set film thicknesses and set carrier concentrations, or different set film thicknesses and set carrier concentrations.

Further, on the surface of the p$^{++}$-type collector layer 1, an n-type carrier storage (CS) layer may be stacked. An IGBT has an advantage of low ON resistance due to conductivity modulation effects. To efficiently reduce the ON resistance by conductivity modulation effects, the n-type CS layer may be provided having an impurity concentration higher than that of the n$^-$-type drift layer 3 and a conductivity type identical to that of the n$^-$-type drift layer 3. The n-type CS layer is a minority carrier barrier and a storage effect for minority carriers is high, whereby the current density between the collect and emitter increases, and conductivity modulation effects are greater.

In silicon carbide base, at a front surface thereof (surface having the p-type base regions 6, 6'), MOS gate (insulated gate including a metal, an oxide film, and a semiconductor) structures (device structures) are provided. In the IGBT regions 52, MOS gates are formed by the p-type base regions 6', n$^+$-type emitter regions (fourth semiconductor regions of the first conductivity type) 8, p$^+$-type collector regions 7, gate insulating films 9, and gate electrodes 10. In the thyristor regions 51, the MOS gates are formed by the p-type base regions 6, n$^+$-type cathode regions (second semiconductor regions of the first conductivity type) 14, the gate insulating films 9, and the gate electrodes 10.

In particular, the p-type base regions 6, 6' are provided in a surface layer of the n$^-$-type drift layer 3 and are formed by ion implantation. In the p-type base regions 6, the n$^+$-type cathode regions 14 having an impurity concentration higher than that of the n$^-$-type drift layer 3 are selectively provided. In the p-type base regions 6', the n$^+$-type emitter regions 8 having an impurity concentration higher than that of the n$^-$-type drift layer 3 are selectively provided. In the IGBT regions 52, the p$^+$-type collector regions 7 may be selectively provided. In an instance in which the p$^+$-type collector regions 7 are provided, each of the p$^+$-type collector regions 7 is provided so as to be sandwiched between two of the n$^+$-type emitter regions 8. In an instance in which the p$^+$-type collector regions 7 are not provided, the p-type base regions 6' are provided in place of the p$^+$-type collector regions 7.

The gate insulating films 9 are provided on the surfaces of the p-type base regions 6, in regions thereof sandwiched between the n$^-$-type drift layer 3 and the n$^+$-type emitter regions 8. Each of the gate insulating films 9 are further provided on the surface of the n$^-$-type drift layer 3. The gate electrodes 10 are provided on the gate insulating films 9. An interlayer insulating film 11 is provided so as to cover the gate electrodes 10.

The interlayer insulating film 11 is provided on the front surface of the silicon carbide base. In contact holes penetrating through the interlayer insulating film 11 in the depth direction, the n$^+$-type emitter regions 8 are exposed. In the thyristor regions 51, the n$^+$-type cathode regions 14 are exposed. The cathode electrodes (first electrodes) 12 are in contact with the n$^+$-type cathode regions 14 through contact holes that penetrate through the interlayer insulating film 11 in the depth direction and the cathode electrodes 12 are electrically insulated from the gate electrodes 10 by the interlayer insulating film 11. In the IGBT regions 52, the n$^+$-type emitter regions 8 and the p$^+$-type collector regions 7 are exposed. The emitter electrodes (second electrodes) 12' are in contact with the n$^+$-type emitter regions 8 and the p$^+$-type collector regions 7 through contact holes that penetrate through the interlayer insulating film 11 in the depth direction and the emitter electrodes 12' are electrically insulated from the gate electrodes 10 by the interlayer insulating film 11. In an instance in which the p$^+$-type collector regions 7 are not provided, the emitter electrodes 12' are in contact with the n$^+$-type emitter regions 8 and the p-type base regions 6'. On the surfaces of the cathode electrodes 12 and the emitter electrodes 12', electrode wiring 13 is provided, and a protective film containing a polyimide may be provided to protect the electrode wiring 13. On a back surface of the silicon carbide base (i.e., back surface of the p$^{++}$-type collector layer 1), a back electrode (not depicted) is provided.

Further, in the first embodiment, the cathode electrodes 12 of the thyristor regions 51 and the emitter electrodes 12' of the IGBT regions 52 are connected by the electrode wiring 13. Therefore, the p-type base regions 6' of the IGBT regions 52 have a potential equal to that of the emitter electrodes 12' of the thyristor regions 51. Further, the p-type base regions 6 of the thyristor regions 51 and the p-type base regions 6' of the IGBT regions 52 are connected by the MOS structures. In other words, between the p-type base regions 6 of the thyristor regions 51 and the p-type base regions 6' of the IGBT regions 52, a parasitic P-channel is formed intervening the gate electrodes 10; and the p-type base regions 6 of the thyristor regions 51 and the p-type base regions 6' of the IGBT regions 52 have the same potential.

In the silicon carbide semiconductor device 50 as such, on-operation of the IGBT regions 52 occurs by an application of positive ON voltage to the gate electrodes 10. At this time, holes that flow in from the back electrode collect in the p-type base regions 6 of the thyristor regions 51, whereby the potential of the p-type base regions 6 increases and NPNs of the thyristor regions 51 perform transistor operation. The thyristor regions 51 are not easily affected by low channel mobility like IGBTs due to electron current flowing in a vertical direction and the NPNs of the thyristor regions 51 have a resistance lower than that of n-channel transistors of the IGBT regions 52, whereby the ON resistance decreases.

Further, in the p-type base regions 6 of the thyristor regions 51, the holes that flow in are not directly pulled out from the cathode electrodes 12 and therefore, in the first embodiment, the hole density in the n$^-$-type drift layer 3 does not easily decrease compared to the conventional IGBT. Therefore, the ON resistance decreases.

On the other hand, by an application of negative voltage to the gate electrodes 10, the p-type base regions 6 of the thyristor regions 51 and the p-type base regions 6' of the IGBT regions 52 conduct with the p-channel, the potential of the p-type base regions 6 of the thyristor regions 51 becomes equal to that of the emitter electrodes 12' of the IGBT regions 52, the potential of the p-type base regions 6 of the thyristor regions 51 decreases, and the NPNs turn off.

Further, the p-type base regions 6 of the thyristor regions 51 are configured by low-concentration p-type base regions 6a and high-concentration p-type base regions 6b having an impurity concentration higher than that of the low-concentration p-type base regions 6a. The low-concentration p-type base regions 6a are provided in a surface layer of the n$^-$-type drift layer 3 and have an impurity concentration in a range, for example, from $1\times10^{15}$/cm$^3$ to $1\times10^{16}$/cm$^3$. The high-concentration p-type base regions 6b have an impurity concentration in a range, for example, from $1\times10^{17}$/cm$^3$ to $1\times10^{18}$/cm$^3$, are provided closer to the p$^{++}$-type collector layer 1 than is the low-concentration p-type base regions 6a. The low-concentration p-type base regions 6a and the high-concentration p-type base regions 6b are in contact with one another.

During reverse bias application, punch through to n-type regions of the surface of the silicon carbide base may be prevented by the high-concentration p-type base regions 6b. Further, electron injection may be increased by the low-concentration p-type base regions 6a. Here, as depicted in FIG. 1, the p-type base regions 6' of the IGBT regions 52 may be configured by low-concentration p-type base regions 6a' and high-concentration p-type base regions 6b' having an impurity concentration higher than that of the low-concentration p-type base regions 6a.

Further, as depicted in FIG. 1, to increase electron injection in the vertical direction, in the thyristor regions 51, the structure may be such that a portion of the high-concentration p-type base regions 6b is not provided. For example, the structure may be such that at positions facing the cathode electrodes 12, the high-concentration p-type base regions 6b are not provided. A width w of these regions free of the high-concentration p-type base regions 6b may be about equal to a thickness h of the p-type base regions 6. When the width w is too wide, a depletion layer reaches the n$^+$-type emitter regions 8 during reverse bias and punch-through occurs; when the width w is too narrow, electron injection in the vertical direction is insufficient.

Figure 2:
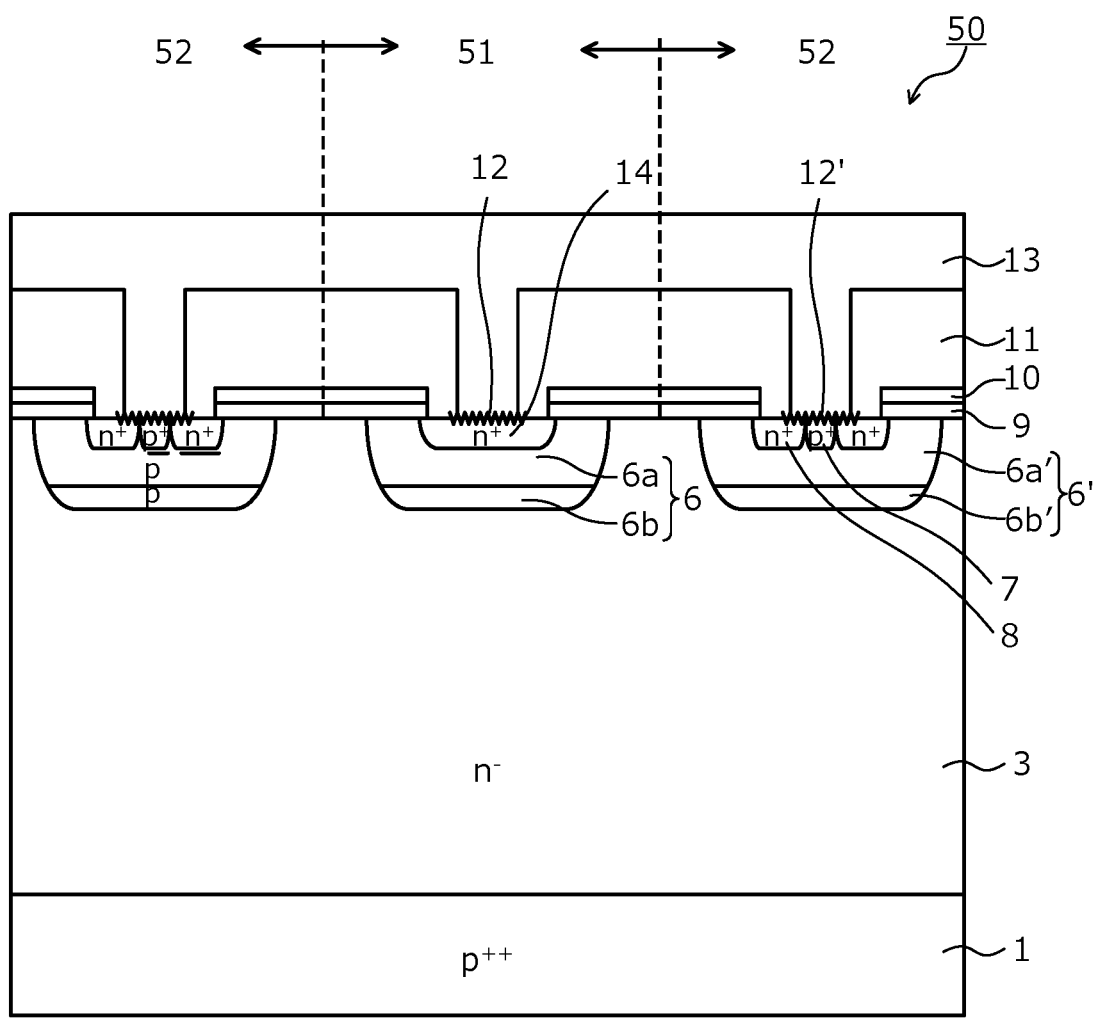
FIG. 2 is a cross-sectional view of another structure of the silicon carbide semiconductor device according to the first embodiment.

FIG. 2 is a cross-sectional view of another structure of the silicon carbide semiconductor device according to the first embodiment. As depicted in FIG. 2, in the thyristor regions 51, to increase the speed of off-operation, the high-concentration p-type base regions 6b may be partially connected to one another. For example, the high-concentration p-type base regions 6b may have a lattice-like planar shape.

Figure 3:
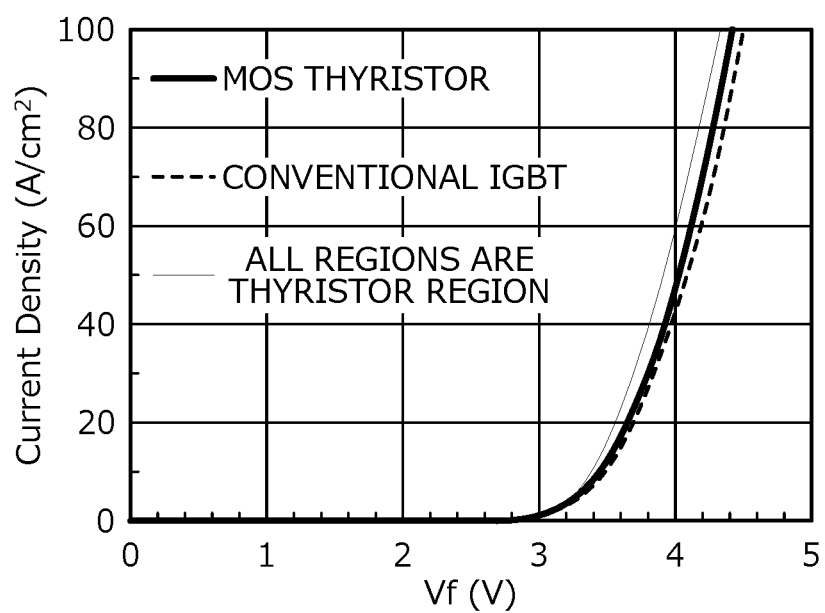
FIG. 3 is a graph of I-V characteristics of the silicon carbide semiconductor device according to the first embodiment and a conventional silicon carbide semiconductor device.

FIG. 3 is a graph of I-V characteristics of the silicon carbide semiconductor device according to the first embodiment and the conventional silicon carbide semiconductor device. In FIG. 3, a horizontal axis represents forward voltage Vf in units of V. A vertical axis indicates forward current density in units of A/cm$^2$. FIG. 3 depicts I-V characteristics of a MOS thyristor of the first embodiment, a conventional IGBT, and a silicon carbide semiconductor device in which all regions are a thyristor region. As depicted in FIG. 3, in the MOS thyristor of the first embodiment, the forward current density is higher than that in the conventional IGBT for the same forward voltage Vf and the ON resistance is decreasing.

A method of manufacturing the silicon carbide semiconductor device according to the first embodiment is described taking, as an example, an instance of fabrication (manufacturing) in which silicon carbide is used as a semiconductor material. FIGS. 4, 5, 6, 7, and 8 are cross-sectional views of states of the silicon carbide semiconductor device according to the first embodiment during manufacture.

Figure 4:
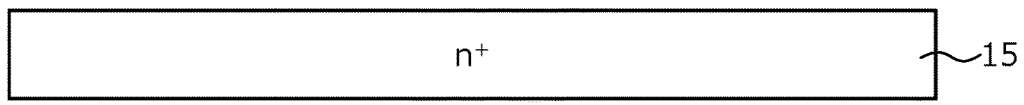
FIG. 4 is a cross-sectional view of a state of the silicon carbide semiconductor device according to the first embodiment during manufacture.
Figure 5:
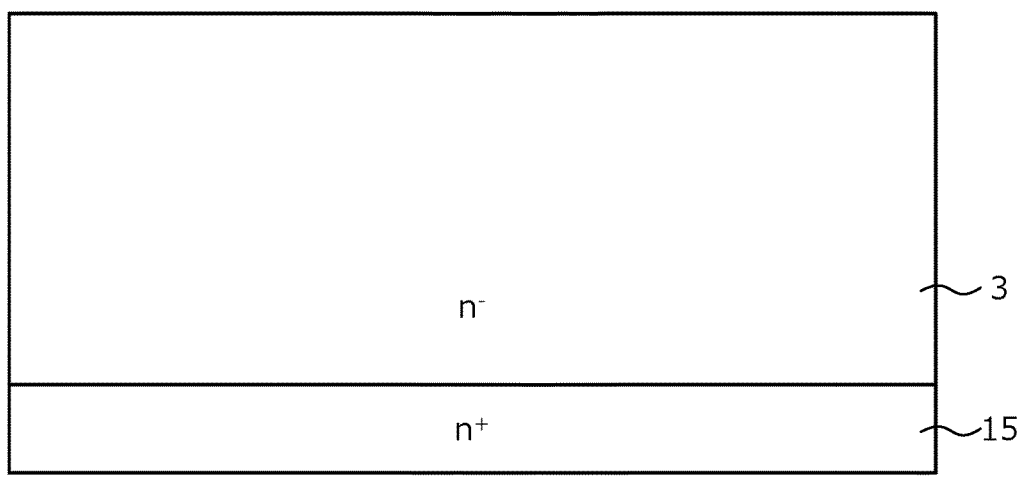
FIG. 5 is a cross-sectional view of a state of the silicon carbide semiconductor device according to the first embodiment during manufacture.

First, an n$^+$-type silicon carbide semiconductor substrate 15 containing an n-type silicon carbide is prepared. The state up to here is depicted in FIG. 4. Next, on a first main surface (front surface, Si-face) of the n$^+$-type silicon carbide semiconductor substrate 15, the n$^-$-type drift layer 3 is deposited by epitaxial growth. For example, to manufacture a 20 kV silicon carbide semiconductor device, the n$^-$-type drift layer 3 is deposited to have a thickness of about 225 μm and an impurity concentration of $2-10^{14}/cm^3$. The state up to here is depicted in FIG. 5.

Figure 6:
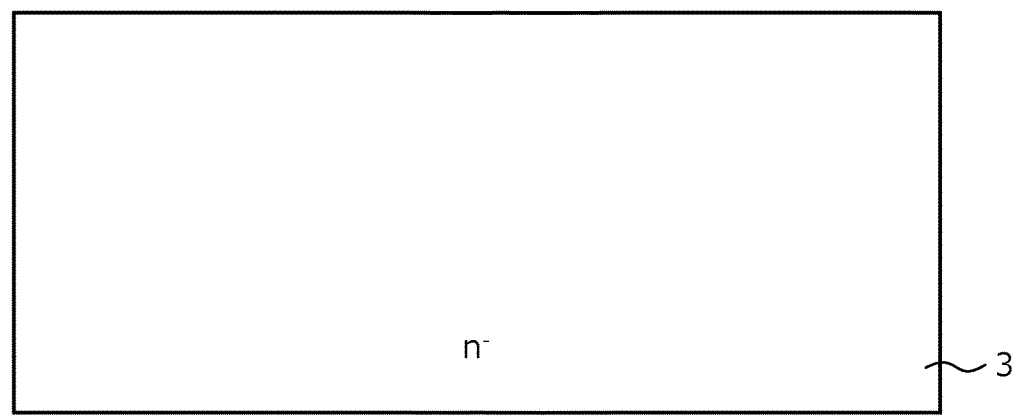
FIG. 6 is a cross-sectional view of a state of the silicon carbide semiconductor device according to the first embodiment during manufacture.
Figure 7:
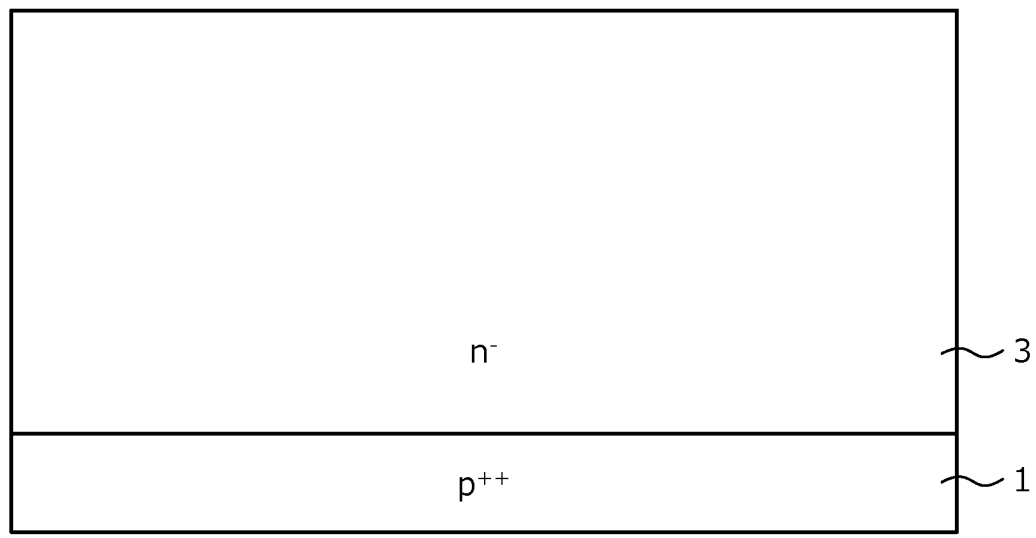
FIG. 7 is a cross-sectional view of a state of the silicon carbide semiconductor device according to the first embodiment during manufacture.

Next, the n$^+$-type silicon carbide semiconductor substrate 15 is ground by back grinding, thereby forming a freestanding n-type substrate from the n$^-$-type drift layer 3. The state up to here is depicted in FIG. 6. Next, on a back surface of the n$^-$-type drift layer 3, the p$^{++}$-type collector layer 1 is deposited by epitaxial growth. Further, the p$^{++}$-type collector layer 1 may be formed by ion implantation of a p-type impurity. The state up to here is depicted in FIG. 7.

Next, on the surface of the n$^-$-type drift layer 3, an ion implantation mask opened at portions thereof corresponding to formation regions of the high-concentration p-type base regions 6b, 6b' is formed. Next, the ion implantation mask is used as a mask and the high-concentration p-type base regions 6b, 6b' are formed in the n$^-$-type drift layer 3 by ion implantation of p-type impurity. For example, the high-concentration p-type base regions 6b, 6b' are formed to have an impurity concentration of $3\times10^{18}/cm^3$ and a thickness of 0.5 μm. Next, the ion implantation mask is removed.

Next, an ion implantation mask opened at portions thereof corresponding to formation regions of the low-concentration p-type base regions 6a, 6a' is formed on the surface of the n$^-$-type drift layer 3. Next, the low-concentration p-type base regions 6a, 6a' are formed in a surface layer of the n$^-$-type drift layer 3 by using the ion implantation mask as a mask and ion-implanting a p-type impurity by an acceleration energy lower than an acceleration energy used when the high-concentration p-type base regions 6b, 6b' are formed. For example, the low-concentration p-type base regions 6a, 6a' are formed having an impurity concentration of $1\times10^{17}/cm^3$ and a thickness of 0.5 μm. Next, the ion implantation mask is removed.

The low-concentration p-type base regions 6a, 6a' and the high-concentration p-type base regions 6b, 6b' may be formed by a combination of epitaxial growth and ion implantation. For example, an ion implantation mask opened at portions thereof corresponding to formation regions of the high-concentration p-type base regions 6b, 6b' is formed on the surface of the n$^-$-type drift layer 3. Next, the high-concentration p-type base regions 6b, 6b' are formed in a surface layer of the n$^-$-type drift layer 3 by ion implantation of a p-impurity type, using the ion implantation mask as a mask. Next, the ion implantation mask is removed.

Next, a p-type layer having an impurity concentration about equal to that of the low-concentration p-type base regions 6a, 6a' is deposited by epitaxial growth. Next, on the surface of the p-type layer, an ion implantation mask opened at portions thereof corresponding to a region of the n$^-$-type drift layer 3 is formed. Next, the n$^-$-type drift layer 3 is formed by inverting the p-type layer into an n-type by ion implantation of an n-type, using the ion implantation mask as a mask. Next, the ion implantation mask is removed. In this instance, in the p-type layer, portions thereof not ion-implanted form the low-concentration p-type base regions 6a, 6a'.

In a method of epitaxial growth, the low-concentration p-type base regions 6a, 6a' are formed by epitaxial growth and the low-concentration p-type base regions 6a, 6a' are formed having a high quality by an ion implantation, thereby enabling characteristics of an amplification factor, etc. of the silicon carbide semiconductor device 50 to be improved.

Next, the n$^+$-type cathode regions 14 and the n$^+$-type emitter regions 8 are selectively formed in surface layers of the p-type base regions 6, 6' by photolithography and ion implantation of an n-type. Next, the p$^+$-type collector regions 7 are selectively formed in the surface layers of the p-type base regions 6, 6' by photolithography and ion implantation of a p-type. At this time, the p$^+$-type collector regions 7 are not formed in the thyristor regions 51.

Figure 8:
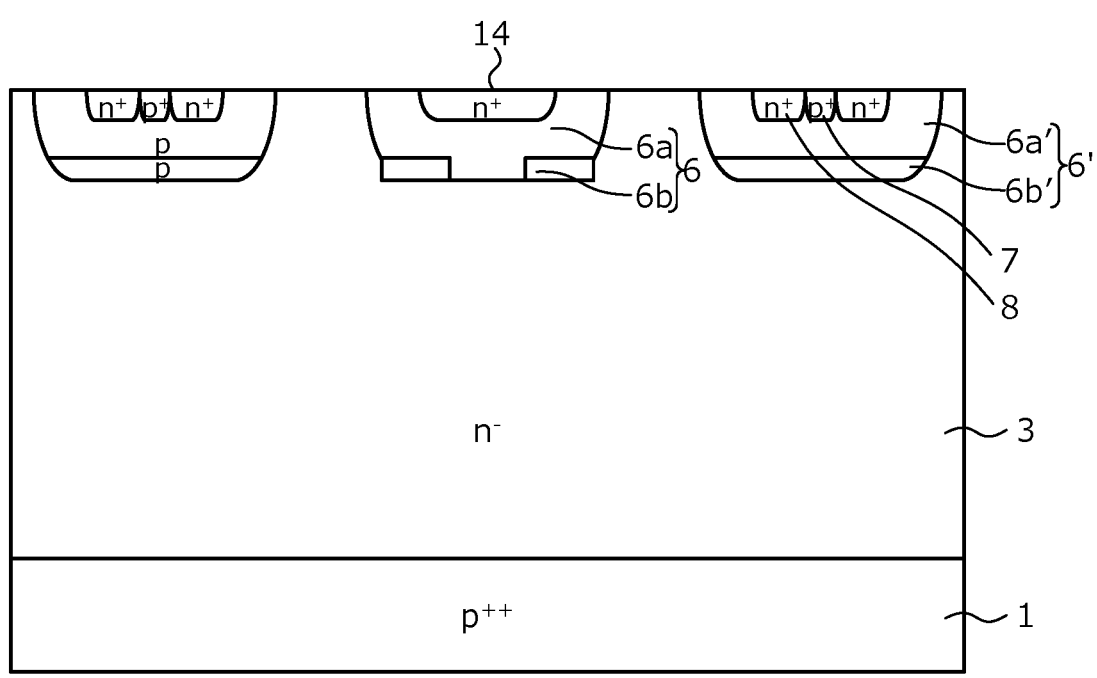
FIG. 8 is a cross-sectional view of a state of the silicon carbide semiconductor device according to the first embodiment during manufacture.

A sequence of the ion implantations for forming the p-type base regions 6, 6', the n$^+$-type cathode regions 14, the n$^+$-type emitter regions 8, and the p$^+$-type collector regions 7 described above may be variously changed. Next, an activation annealing (heat treatment) for activating diffusion regions respectively formed by the ion implantations is performed. For example, the activation annealing is performed for 10 minutes at a temperature of 1923K. The state up to here is depicted in FIG. 8.

Next, the front surface (surface having the p$^+$-type base regions 6, 6') of the silicon carbide base is thermally oxidized, thereby forming the gate insulating films 9 of a thickness of, for example, about 70 nm. Next, on the gate insulating films 9, for example, a polysilicon (poly-Si) layer is formed and patterned as the gate electrodes 10.

Next, the interlayer insulating film 11 is formed so as to cover the gate electrodes 10 and a heat treatment (reflow) is performed after patterning. During the patterning of the interlayer insulating film 11, contact holes are formed and the gate insulating films 9 exposed in the contact holes are removed, whereby the n$^+$-type emitter regions 8 and the p$^+$-type collector regions 7 are exposed. Next, for example, the cathode electrodes 12 and the emitter electrodes 12' are formed by a sputtering method so as to be embedded in the contact holes.

Next, on the back surface of the p$^{++}$-type collector layer 1, the back electrode (not depicted) is formed. Next, on the cathode electrodes 12 and the emitter electrodes 12', the electrode wiring 13 is formed. Next, on the front surface of the silicon carbide base, a protective film (not depicted) is formed. Thereafter, silicon carbide base is cut (diced) into individual chips, whereby the silicon carbide semiconductor device depicted in FIGS. 1 and 2 is completed.

As described above, according to the first embodiment, the p-type base regions of the thyristor regions and the p-type base regions of the IGBT regions are connected by the MOS structures. When on-operations of the IGBT regions occur, holes that flow in from the back electrode collect in the p-type base regions of the thyristor regions, whereby the potential of the p-type base regions increases and the NPNs of the thyristor regions perform transistor operation. The thyristor regions are not easily affected by low channel mobility like the IGBTs due to the electron current flowing in the vertical direction and the NPNs of the thyristor regions have a resistance lower than that of the n-channel transistors of the IGBT regions, whereby the ON resistance decreases.

Further, the p-type base regions of the thyristor regions are configured by the low-concentration p-type base regions and the high-concentration p-type base regions. During application of reverse bias, punch-through to the n-type regions at the surface of the silicon carbide base may be prevented by the high-concentration p-type base regions. The low-concentration p-type base regions enable electron injection to be increased.

Figure 9:
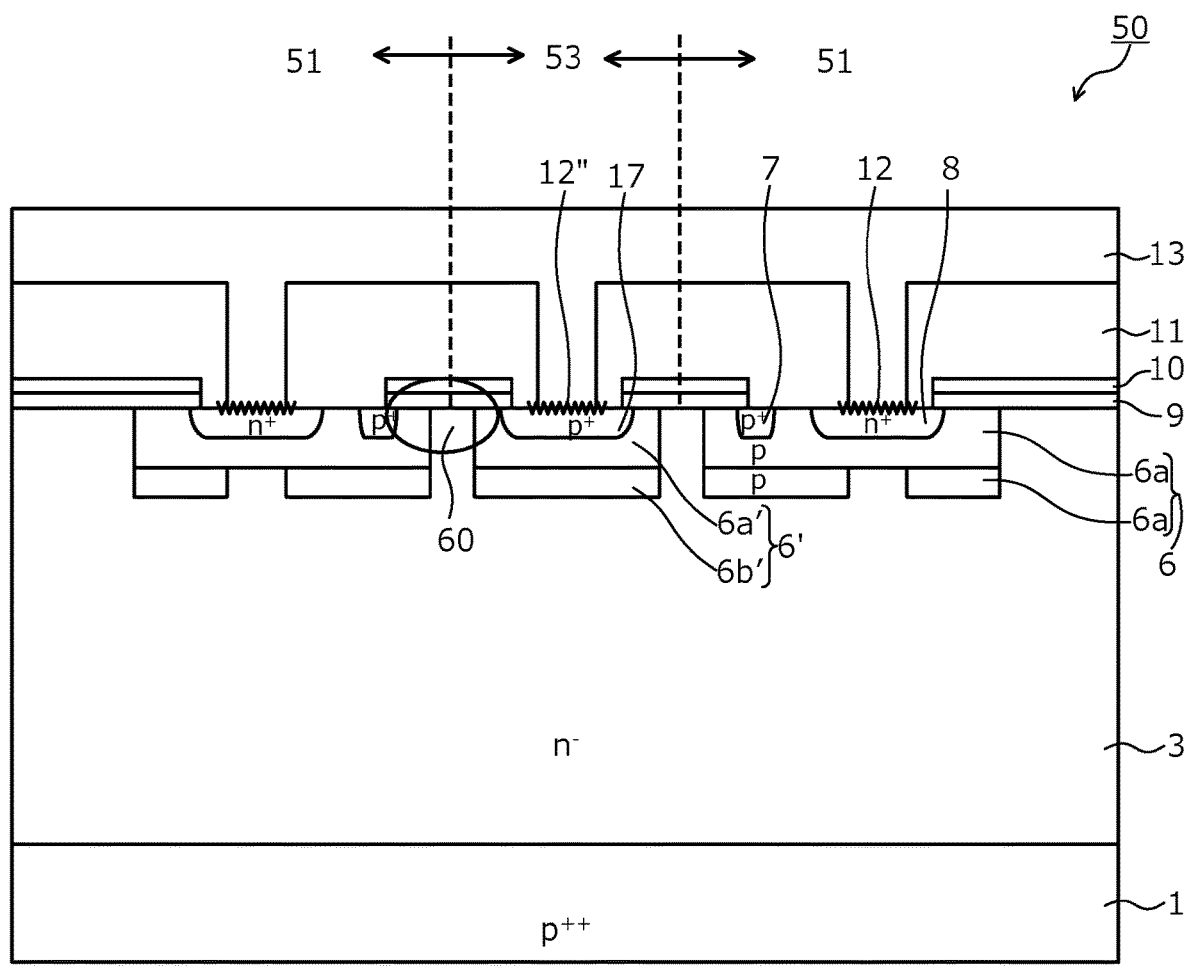
FIG. 9 is a cross-sectional view of a structure of a silicon carbide semiconductor device according to a second embodiment.

Next, a structure of a silicon carbide semiconductor device according to a second embodiment is described. FIG. 9 is a cross-sectional view of the structure of the silicon carbide semiconductor device according to the second embodiment.

As depicted in FIG. 9, the silicon carbide semiconductor device according to the second embodiment differs from the silicon carbide semiconductor device according to the first embodiment in that the thyristor regions 51 and p-channel MOS transistor regions (second semiconductor areas) 53 are provided in parallel, adjacent to one another. The thyristor regions 51 are regions free of p-type regions for fixing the potential and the cathode electrodes 12 to the p-type base regions 6. Between the p-channel MOS transistor regions 53 and the thyristor regions 51, p-channel MOS structures for fixing the potential the p-type base regions 6 of the thyristor regions 51 at the potential of the cathode electrodes 12 during off-operation are provided.

The p-channel MOS structures of the p-channel MOS transistor regions 53 include $p^+$-type source regions (fifth semiconductor regions of the second conductivity type) 17 having an impurity concentration higher than that of the p-type base regions 6 and selectively provided in the surface layers of the p-type base regions 6, each of the $p^+$-type source regions 17 being surrounded by one of the p-type base regions 6. Further, source electrodes 12" of the p-channel MOS transistor regions are in contact with the $p^+$-type source regions 17. On surfaces of the p-type base regions 6' and the $n^-$-type drift layer 3, the gate insulating films 9 is provided. On surfaces of the gate insulating films 9, the gate electrodes 10 are provided. The interlayer insulating film 11 is provided so as to cover the gate electrodes 10.

Further, the $p^+$-type collector regions 7 may be provided selectively in the surface layers of the p-type base regions 6 of the thyristor regions 51. In this instance, in regions of the surfaces of the p-type base regions 6, sandwiched between the $n^-$-type drift layer 3 and the $p^+$-type collector regions 7, the gate insulating films 9 are provided.

The silicon carbide semiconductor device 50 of the second embodiment, similarly to the first embodiment, by an application of positive ON voltage to the gate electrodes 10, on-operation occurs in N-channel regions of the thyristor regions 51. At this time, holes that flow in from the back electrode collect in the p-type base regions 6 of the thyristor regions 51, whereby the potential of the p-type base regions 6 increases and the NPNs of the thyristor regions 51 perform transistor operation. The thyristor regions 51 are not easily affected by low channel mobility like IGBTs due to electron current flowing in the vertical direction, and the NPNs of the thyristor regions 51 have a resistance lower than that of the n-channel transistors of the p-channel MOS transistor regions 53, whereby the ON resistance decreases.

Further, by an application of negative voltage to the gate electrodes 10, the p-type base regions 6 of the thyristor regions 51 and the p-type base regions 6' of the p-channel MOS transistor regions 53 conduct with the p-channel, and the potential of the p-type base regions 6 of the thyristor regions 51 is set equal to that of the source electrodes 12" of the p-channel MOS transistor regions 53, whereby the potential decreases and the NPNs turn off. During an OFF state, the p-channel is formed at a position indicated by an OFF channel 60 in FIG. 9.

In the second embodiment, the p-channel MOS transistor regions 53 are not provided with n-type regions, only the $p^+$-type source regions 17. Therefore, a width of the p-channel MOS transistor regions 53 may be reduced, enabling cell pitch to be shorter than that in the first embodiment.

Further, similarly to the first embodiment, the p-type base regions 6 of the thyristor regions 51 are configured by the low-concentration p-type base regions 6a and the high-concentration p-type base regions 6b having an impurity concentration higher than that of the low-concentration p-type base regions 6a, and has effects similar to those of the first embodiment. Similarly, in the thyristor regions 51, the structure may be such that a portion is free of the high-concentration p-type base regions 6b. Furthermore, to increase the speed of off-operation, the high-concentration p-type base regions 6 may be partially connected to one another. Similarly, in the p-channel MOS transistor regions 53 as well, the p-type base regions 6' may be configured by the low-concentration p-type base regions 6a' and the high-concentration p-type base regions 6b' having an impurity concentration higher than that of the low-concentration p-type base regions 6a'.

The p-channel MOS transistor regions 53 need not all be provided along a viewing direction of FIG. 9 (direction orthogonal to direction along which the thyristor regions 51 and the p-channel MOS transistor regions 53 are arranged) and, for example, in a plan view, the p-channel MOS transistor regions 53 may have an island-like shape.

Further, a method of manufacturing the silicon carbide semiconductor device according to the second embodiment is similar to the method of manufacturing the silicon carbide semiconductor device according to the first embodiment and therefore, description thereof is omitted herein.

As described above, according to the second embodiment, the p-type base regions of the thyristor regions and the p-type base regions of the p-channel MOS transistor regions are connected by the MOS structures. As a result, effects similar to those of the first embodiment are obtained. Further, the p-channel MOS transistor regions are only the $p^+$-type source regions and therefore, enable reductions in width and shortening of the cell pitch as compared to the first embodiment.

Figure 10:
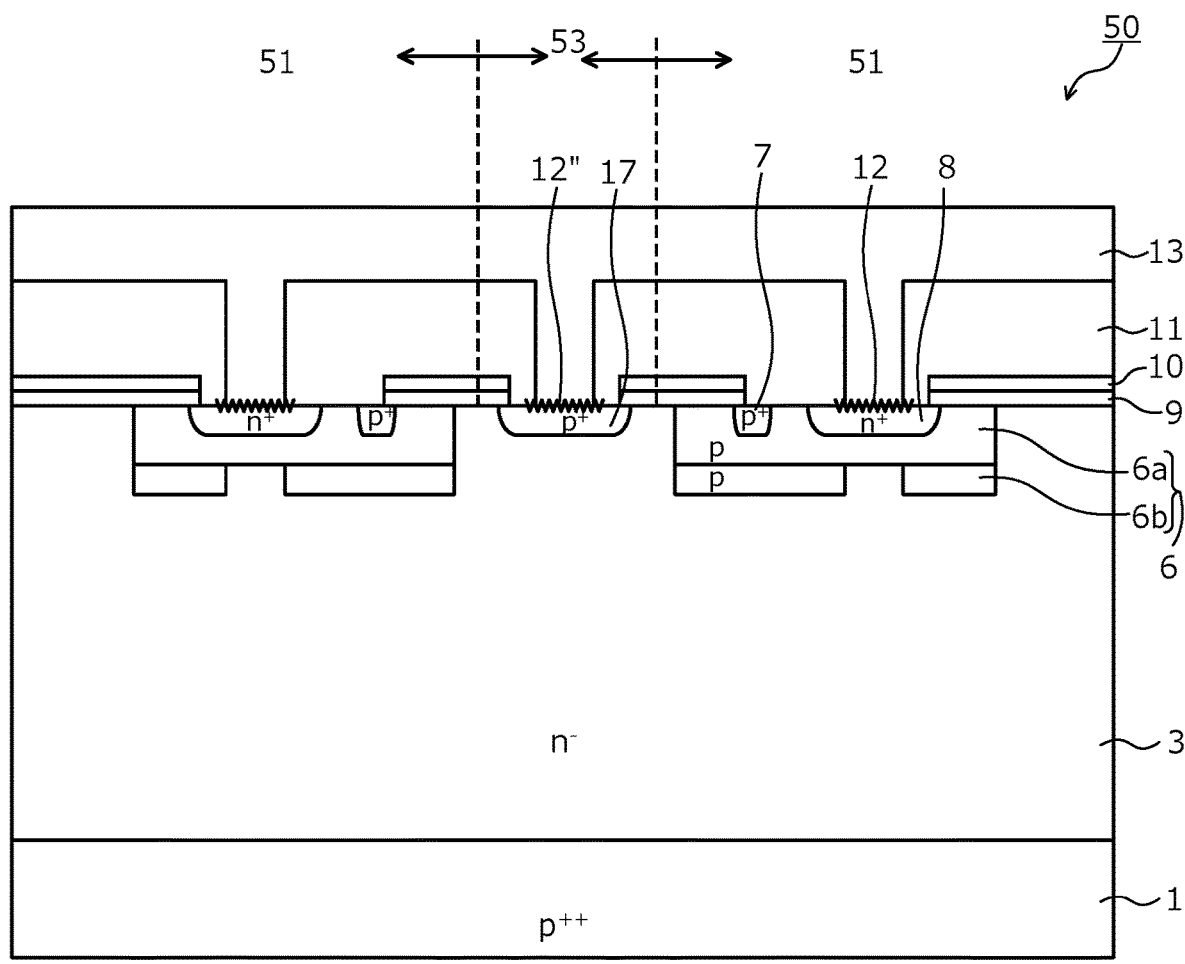
FIG. 10 is a cross-sectional view of a structure of a silicon carbide semiconductor device according to a third embodiment.

Next, a structure of a silicon carbide semiconductor device according to a third embodiment is described. FIG. 10 is a cross-sectional view of the structure of the silicon carbide semiconductor device according to the third embodiment.

As depicted in FIG. 10, the silicon carbide semiconductor device according to the third embodiment differs from the silicon carbide semiconductor device according to the second embodiment in that in the p-channel MOS transistor regions 53, the p-type base regions 6' that surround the $p^+$-type source regions 17 are not provided. The thyristor regions 51 are regions free of the p-type regions for fixing the potential and the emitter electrodes 12' to the p-type base regions 6. Between the p-channel MOS transistor regions 53 and the thyristor regions 51, during off-operation, the p-channel MOS structures for fixing the potential of the p-type base regions 6 of the thyristor regions 51 at the potential of the cathode electrodes 12 are provided.

The p-channel MOS structures of the p-channel MOS transistor regions 53 include the $p^+$-type source regions 17 selectively provided in a surface layer of the $n^-$-type drift layer 3 and do not include the p-type base regions 6'. The source electrodes 12" of the p-channel MOS transistor regions are in contact with the $p^+$-type source regions 17. Further, the gate insulating films 9 are provided in regions on the surfaces of the n⁻-type drift layer 3 and the p⁺-type source regions 17. On surfaces of the gate insulating films 9, the gate electrodes 10 are provided. The interlayer insulating film 11 is provided so as to cover the gate electrodes 10.

Further, the p⁺-type collector regions 7 may be selectively provided in the surface layers of the p-type base regions 6 of the thyristor regions 51. In this instance, the gate insulating films 9 are provided in regions on the surfaces of the p-type base regions 6, sandwiched between the n⁻-type drift layer 3 and the p⁺-type collector regions 7.

The silicon carbide semiconductor device 50 of the third embodiment performs an operation similar to that of the silicon carbide semiconductor device 50 of the second embodiment. In the third embodiment, the p⁺-type source regions 17 of the p-channel MOS structures connected to the source electrodes 12″ are a significant distance from the back surface and therefore, pulling out of hole current from the back surface is weaker than in the second embodiment. Therefore, hole storage improves, enabling the ON resistance to be lower than in the second embodiment.

Further, similarly to the second embodiment, in the third embodiment, the p-channel MOS transistor regions 53 do not include n-type regions, only the p⁺-type source regions 17. Therefore, a width of the p-channel MOS transistor regions 53 may be reduced, enabling cell pitch to be shorter than that in the first embodiment.

Further, similarly to the first embodiment, the p-type base regions 6 of the thyristor regions 51 are configured by the low-concentration p-type base regions 6a and the high-concentration p-type base regions 6b having an impurity concentration higher than that of the low-concentration p-type base regions 6a, and have effects similar to those of the first embodiment. Similarly, in the thyristor regions 51, the structure may be such that a portion is free of the high-concentration p-type base regions 6b. Furthermore, to increase the speed of off-operation, the high-concentration p-type base regions 6 may be partially connected to one another.

Further, a method of manufacturing the silicon carbide semiconductor device according to the third embodiment is similar to the method of manufacturing the silicon carbide semiconductor device according to the first embodiment and therefore, description thereof is omitted herein.

As described above, according to the third embodiment, the p-channel MOS structures of the p-channel MOS transistor regions include the p⁺-type source regions selectively provided in a surface layer of the n⁻-type drift layer and do not include the p-type base regions. As a result, the p⁺-type source regions are a significant distance from the back surface and therefore, pulling out of hole current from the back surface is weaker than in the second embodiment. Therefore, hole storage improves, enabling the ON resistance to be lower than in the second embodiment.

Figure 11:
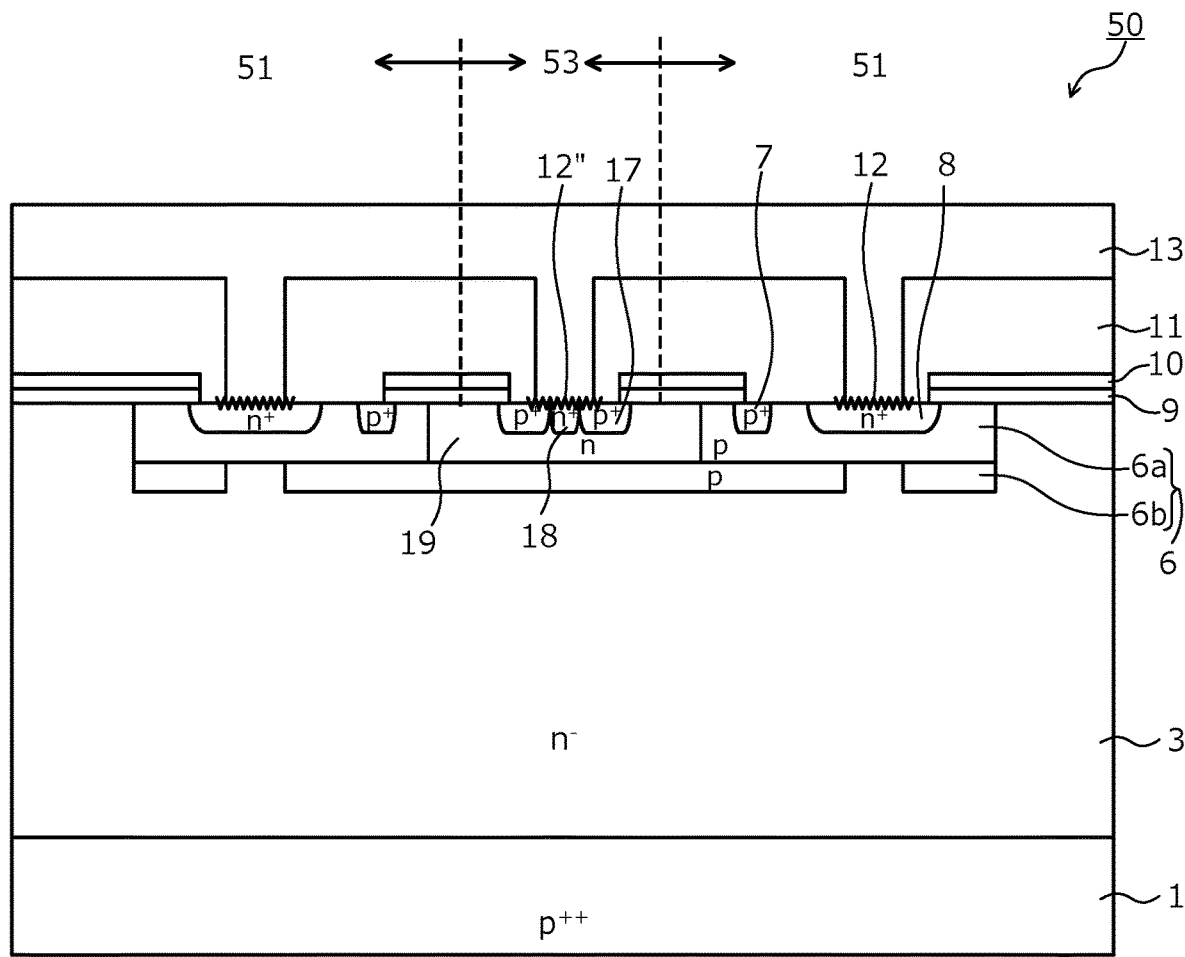
FIG. 11 is a cross-sectional view of a structure of a silicon carbide semiconductor device according to a fourth embodiment.

Next, a structure of a silicon carbide semiconductor device according to a fourth embodiment is described. FIG. 11 is a cross-sectional view of the structure of the silicon carbide semiconductor device according to the fourth embodiment.

As depicted in FIG. 11, the silicon carbide semiconductor device according to the fourth embodiment differs from the silicon carbide semiconductor device according to the third embodiment in that in the p-channel MOS transistor regions 53, n-type base regions (sixth semiconductor regions of the first conductivity type) 19 surrounded by the p-type base regions 6 of the thyristor regions 51 are provided. For example, an impurity concentration of the n-type base regions 19 is in a range from $1 \times 10^{15}/cm^3$ to $1 \times 10^{18}/cm^3$. A further difference from the third embodiment is that the p⁺-type source regions 17 are selectively provided in surface regions of the n-type base regions 19. Surrounded by the p-type base regions 6 means that other than the surfaces of the n-type base regions 19 is in contact with the p-type base regions 6. The thyristor regions 51 are regions free of p-type regions for fixing the potential and the cathode electrodes 12 to the p-type base regions 6. Between the p-channel MOS transistor regions 53 and the thyristor regions 51, the p-channel MOS structures for fixing the potential of the p-type base regions 6 of the thyristor regions 51 at the potential of the cathode electrodes 12 during off-operation, are provided.

The p-channel MOS structures of the p-channel MOS transistor regions 53 include the p⁺-type source regions 17 selectively provided in the surface layers of the n-type base regions 19, the gate insulating films 9 are provided in regions on the surfaces of the p⁺-type source regions 17 and the n-type base regions 19. The source electrodes 12″ of the p-channel MOS transistor regions are in contact with the p⁺-type source regions 17 and the n-type base regions 19. Further, n⁺-type contact regions 18 may be provided in the surface layers of the n-type base regions 19. In this instance, the source electrodes 12″ of the p-channel MOS transistor regions are in contact with the p⁺-type source regions 17, the n⁺-type contact regions 18, and the n-type base regions 19. On the surfaces of the gate insulating films 9, the gate electrodes 10 are provided. The interlayer insulating film 11 is provided so as to cover the gate electrodes 10.

Further, the p⁺-type collector regions 7 may be selectively provided in the surface layers of the p-type base regions 6 of the thyristor regions 51. In this instance, the gate insulating films 9 are provided in regions on the surfaces of the p-type base regions 6, sandwiched between the n⁻-type drift layer 3 and the p⁺-type collector regions 7.

The silicon carbide semiconductor device 50 of the fourth embodiment performs an operation similar to that of the silicon carbide semiconductor device 50 of the second embodiment. In the fourth embodiment, the p⁺-type source regions 17 of the p-channel MOS connected to the source electrodes 12″ are completely surrounded by the p-type base regions 6 floating in the thyristor regions 51. Therefore, pulling out of hole current from the back surface is weaker than in the first and the second embodiments, hole storage is improved, and the ON resistance may be reduced. Furthermore, the n-type base regions 19 of the p-channel MOS are fixed at the potential of the cathode electrodes 12 and have no back gate effect, whereby a threshold value of the p-channel MOS may be lower than that in the first to third embodiments and responsiveness during the OFF state is improved.

Further, similarly to the first embodiment, the p-type base regions 6 of the thyristor regions 51 is configured by the low-concentration p-type base regions 6a and the high-concentration p-type base regions 6b having an impurity concentration higher than that of the low-concentration p-type base regions 6a, and has effects similar to those of the first embodiment. Similarly, in the thyristor regions 51, the structure may be such that a portion may be free of the high-concentration p-type base regions 6b. Furthermore, to increase the speed of off-operation, the high-concentration p-type base regions 6b may be partially connected to one another.

Further, a method of manufacturing the silicon carbide semiconductor device according to the fourth embodiment is similar to the method of manufacturing the silicon carbide semiconductor device according to the first embodiment and therefore, description thereof is omitted herein.

As described above, according to the fourth embodiment, the p+-type source regions of the p-channel MOS connected to the source electrodes are completely surrounded by the p-type base regions of the thyristor regions in a floating state. As a result, pulling out hole current from the back surface is weaker than in the first and second embodiments, hole storage is improved, and the ON resistance may be reduced. Furthermore, the n-type base regions of the p-channel MOS are fixed at the potential of the cathode electrodes and have no back gate effect, whereby the threshold value of the p-channel MOS may be lower than that in the first to third embodiments, and the responsiveness during the OFF state may be improved.

Figure 12:
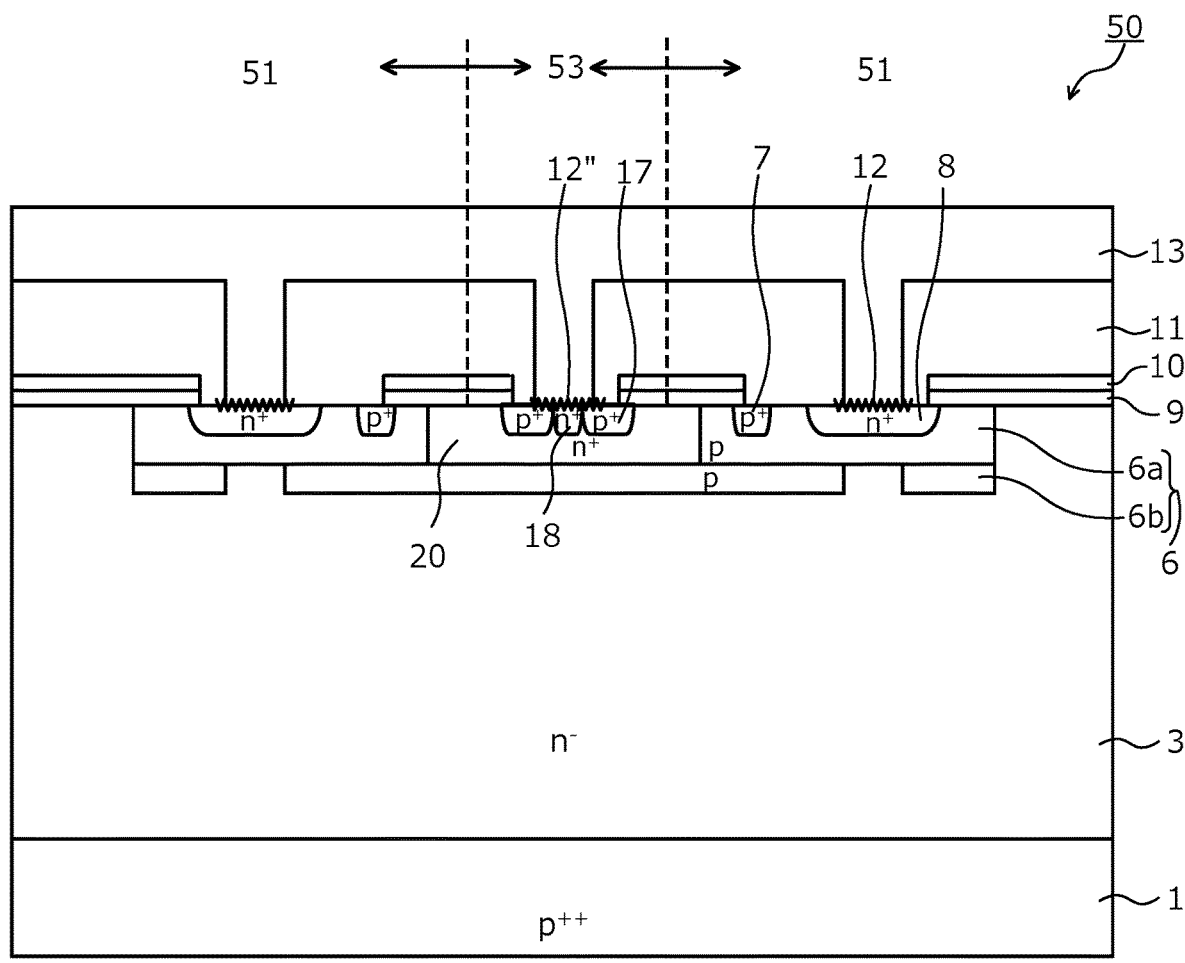
FIG. 12 is a cross-sectional view of a structure of a silicon carbide semiconductor device according to a fifth embodiment.

Next, a structure of a silicon carbide semiconductor device according to a fifth embodiment is described. FIG. 12 is a cross-sectional view of the structure of the silicon carbide semiconductor device according to the fifth embodiment.

As depicted in FIG. 12, the silicon carbide semiconductor device according to the fifth embodiment differs from the silicon carbide semiconductor device according to the fourth embodiment in that an impurity concentration of n+-type base regions 20 (sixth semiconductor regions of the first conductivity type) is higher than the impurity concentration of the n−-type drift layer 3, and higher than that of the n-type base regions 19 of the fourth embodiment. For example, the impurity concentration of the n+-type base regions 20 is in a range from $1 \times 10^{16}/cm^3$ to $1 \times 10^{19}/cm^3$.

In the silicon carbide semiconductor device of the fourth embodiment, current during the ON state is large and a large amount of hole current flows to the p-type base regions 6 floating in the thyristor regions 51. As a result, the hole current passes through the p-type base regions 6 of the thyristor regions 51 and reaches the p+-type source regions 17 of the p-channel MOS structures connected to the potential of the cathode electrodes 12. Therefore, holes are pulled out and the hole storage effect plateaus.

In contrast, in the silicon carbide semiconductor device of the fifth embodiment, the impurity concentration of the n+-type base regions 20 of the p-channel MOS structures is increased, whereby a potential barrier against the holes increases, enabling the hole amount reaching the p+-type source regions 17 to be reduced. Therefore, pulling out of hole current from the back surface is weaker than in the fourth embodiment, hole storage improves, and the ON resistance may be further reduced.

Further, a method of manufacturing the silicon carbide semiconductor device according to the fifth embodiment is similar to the method of manufacturing the silicon carbide semiconductor device according to the first embodiment and therefore, description thereof is omitted herein.

As described above, according to the fifth embodiment, the impurity concentration of the n+-type base regions of the p-channel MOS structures is increased, whereby the potential barrier against the holes increases, enabling the amount holes reaching the p+-type source regions to be reduced. Therefore, pulling out of the hole current from the back surface is weaker than in the fourth embodiment, hole storage improves, and the ON resistance may be further reduced.

Figure 13:
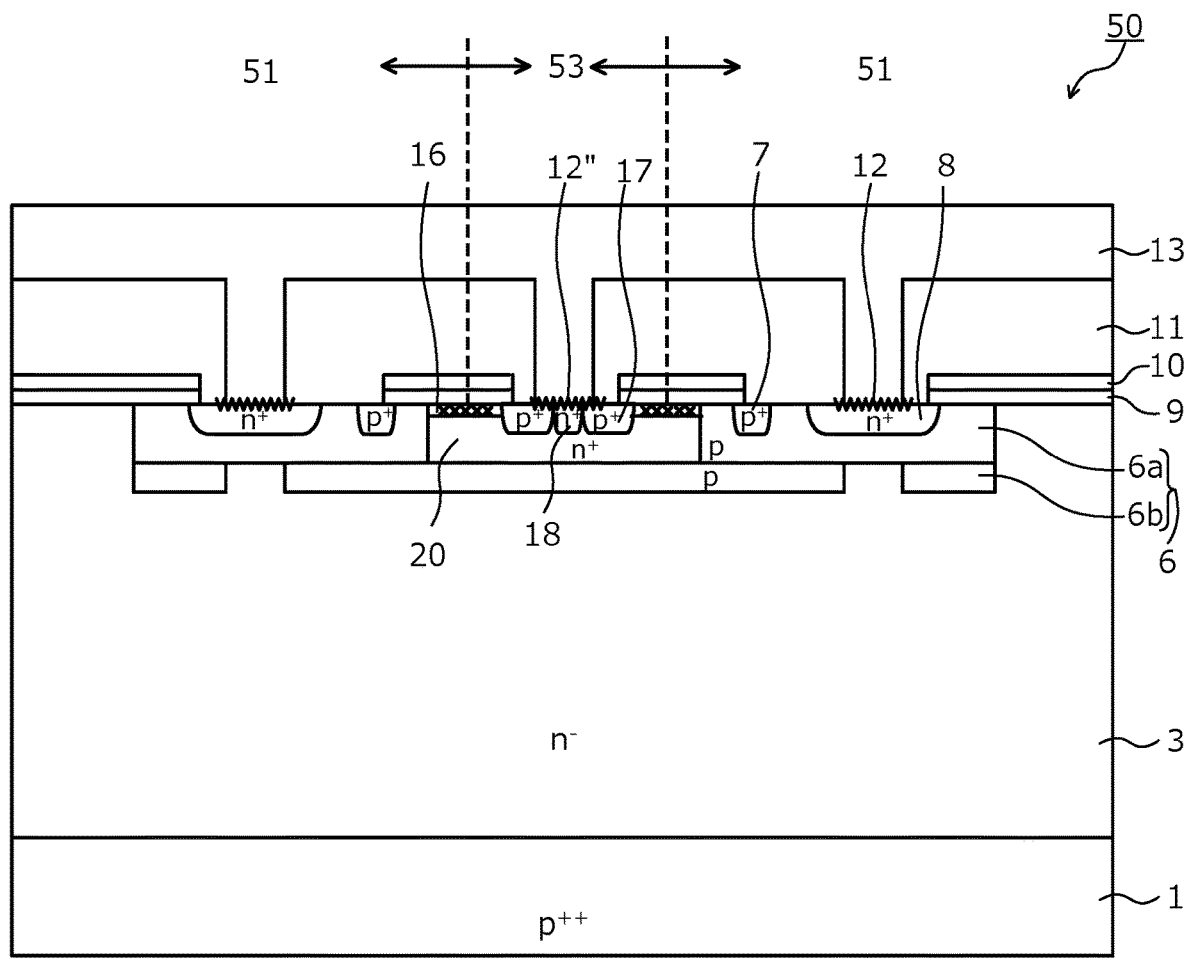
FIG. 13 is a cross-sectional view of a structure of a silicon carbide semiconductor device according to a sixth embodiment.

Next, a structure of a silicon carbide semiconductor device according to a sixth embodiment is described. FIG. 13 is a cross-sectional view of the structure of the silicon carbide semiconductor device according to the sixth embodiment.

As depicted in FIG. 13, the silicon carbide semiconductor device according to the sixth embodiment differs from the silicon carbide semiconductor device according to the fifth embodiment in that p-type channel regions (seventh semiconductor regions of the second conductivity type) 16 are provided in surface layers of the n+-type base regions 20. The p-type channel regions 16 are formed by ion implanting a p-type impurity in the surface layers of the n+-type base regions 20, reduce a threshold value of the p-channel MOS structures, and as a range from 0V to about an n-channel MOS threshold (for example, 3V), have a depletion type MOS structure that turns on even when the gate voltage is 0V.

As a result, turn on occurs even when the gate voltage is 0V and therefore, even when a gate driver is destroyed and the gate potential becomes a value close to that of the potential of the cathode electrodes 12, the OFF state may be maintained. Further, the threshold value of the p-channel MOS structures is low and turn on is facilitated, whereby the responsiveness during the OFF state improves without affecting turn on characteristics.

Further, the p-type channel regions 16 are provided in the surface layer of the n-type base regions 19 of the fourth embodiment, reduce the threshold value of the p-channel MOS structures, reduce the threshold value of the p-channel MOS structures, and as a range from 0V to about the n-channel MOS threshold (for example, 3V), may have the depletion type MOS structure that turns on even when the gate voltage is 0V.

Further, a method of manufacturing the silicon carbide semiconductor device according to the sixth embodiment is similar to the method of manufacturing the silicon carbide semiconductor device according to the first embodiment excluding formation of the p-type channel regions 16 in the surface regions of the n+-type base regions 20 by ion implantation of a p-type impurity and therefore, description thereof is omitted herein.

As described above, according to the sixth embodiment, the p-type channel regions are provided in the surface layers of the n+-type base regions of the p-channel MOS structures, and have the depletion type MOS structure that turns on even when the gate voltage is 0V. As a result, even when a gate driver is destroyed and the gate potential becomes a value close to that of the potential of the cathode electrodes 12, the OFF state may be maintained. Further, the threshold value of the p-channel MOS structures is low and turn on is facilitated, whereby the responsiveness during the OFF state improves without affecting turn on characteristics.

In the foregoing, the present invention may be variously modified within a range not departing from the spirit of the invention and for example, in the embodiments described above, dimensions, impurity concentrations, etc. of regions may be variously set according to necessary specifications. Further, in the present invention, while the first conductivity type is an n-type and the second conductivity type is a p-type in the embodiments, the present invention is similarly implemented when the first conductivity type is a p-type and the second conductivity type is an n-type. Further, in the embodiments, while a silicon carbide semiconductor device having a planar type structure is described as an example, implementation is similar for a trench type structure.

According to the invention, the p-type base regions (first semiconductor regions) of the thyristor region (first semiconductor areas) and the p-type base regions (third semiconductor regions) of the IGBT regions (second semiconductor areas) are connected by the MOS structures. When on-operation of the IGBT regions occurs, holes that flow in from the back electrode collect in the p-type base regions of the thyristor regions, whereby the potential of the p-type base regions increases and the NPNs of the thyristor regions perform transistor operation. The thyristor regions are not easily affected by low channel mobility like the IGBTs due to the electron current flowing in the vertical direction and the NPNs of the thyristor regions have a resistance lower than that of the n-channel transistors of the IGBT regions, whereby the ON resistance decreases.

Further, the p-type base regions of the thyristor regions are configured by the low-concentration p-type base regions (low-impurity-concentration regions) and the high-concentration p-type base regions (high-impurity-concentration regions). During application of reverse bias, punch-through to the n-type regions at the surface of the silicon carbide base may be prevented by the high-concentration p-type base regions. The low-concentration p-type base regions enable electron injection to be increased.

The silicon carbide semiconductor device according to the present invention achieves an effect in that the ON resistance is reduced and power loss may be reduced.

As described above, the silicon carbide semiconductor device and the method of manufacturing the silicon carbide semiconductor device according to the present invention are useful for power semiconductor devices used in power converting equipment such as inverters, power source devices such those in various types of industrial machines, and igniters of automobiles.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
a plurality of first semiconductor areas; and
a plurality of second semiconductor areas disposed adjacent to and alternating with the first semiconductor areas, wherein
the first semiconductor areas have:
a first semiconductor layer of a second conductivity type, having opposite first and second main surfaces;
a second semiconductor layer of a first conductivity type, provided on the first main surface of the first semiconductor layer, the second semiconductor layer having opposite first and second surfaces, the second surface facing the first semiconductor layer;
a plurality of first semiconductor regions of the second conductivity type, selectively provided in a surface layer of the second semiconductor layer, at a first surface side of the second semiconductor layer, the first semiconductor regions having opposite first and second surfaces, the second surfaces of the first semiconductor regions facing the first semiconductor layer;
a plurality of second semiconductor regions of the first conductivity type, selectively provided in surface layers of the first semiconductor regions, at first surface sides of the first semiconductor regions, the second semiconductor regions having an impurity concentration higher than an impurity concentration of the second semiconductor layer;
a plurality of gate insulating films, provided on the first surfaces of the first semiconductor regions and the first surface of the second semiconductor layer;
a plurality of gate electrodes provided on the gate insulating films; and
a plurality of first electrodes electrically connected to the second semiconductor regions, wherein
the second semiconductor areas have:
the first semiconductor layer;
the second semiconductor layer;
a plurality of third semiconductor regions of the second conductivity type, selectively provided in the surface layer of the second semiconductor layer, at the first surface side of the second semiconductor layer, the third semiconductor regions having opposite first and second surfaces, the second surfaces of the third semiconductor regions facing the first semiconductor layer;
the gate insulating films provided on the first surfaces of the third semiconductor regions and the second semiconductor layer;
the gate electrodes; and
a plurality of second electrodes electrically connected to the third semiconductor regions, wherein
the first semiconductor regions respectively include a corresponding one of a plurality of low-impurity-concentration regions provided in the surface layer of the second semiconductor layer and a corresponding one of plurality of high-impurity-concentration regions, the plurality of high-impurity-concentration regions being provided closer to the first semiconductor layer than are the low-impurity-concentration regions, respectively, wherein
the third semiconductor regions have a potential equal to a potential of the first electrodes, wherein
the first semiconductor regions are connected to the third semiconductor regions by MOS structures, and wherein
the high-impurity-concentration regions are provided at positions different from positions facing the first electrodes in a depth direction of the semiconductor device.

2. The silicon carbide semiconductor device according to claim 1, wherein
the second semiconductor areas have a plurality of fourth semiconductor regions of the first conductivity type, selectively provided in surface layers of the third semiconductor regions, at first surface sides of the third semiconductor regions, the fourth semiconductor regions having an impurity concentration higher than the impurity concentration of the second semiconductor layer, and wherein
the second electrodes are in contact with the third semiconductor regions and the fourth semiconductor regions.

3. The silicon carbide semiconductor device according to claim 1, wherein
the second semiconductor areas have a plurality of fifth semiconductor regions of the second conductivity type, selectively provided in the surface layers of the third semiconductor regions, the fifth semiconductor regions having an impurity concentration higher than the impurity concentration of the third semiconductor regions, and wherein
the second electrodes are electrically connected to the fifth semiconductor regions.

4. The silicon carbide semiconductor device according to claim 1, wherein
the second semiconductor areas have a plurality of sixth semiconductor regions of the first conductivity type, provided in the surface layer of the second semiconductor layer, the sixth semiconductor regions being surrounded by the first semiconductor regions of the first semiconductor areas and having opposite first and second surfaces, the second surfaces facing the first semiconductor layer, wherein the third semiconductor regions are selectively provided in surface layers of the sixth semiconductor regions, at first surface sides of the sixth semiconductor regions, wherein the second electrodes are electrically connected to the sixth semiconductor regions and the third semiconductor regions, and wherein the gate insulating films are provided on the first surfaces of the sixth semiconductor regions and the third semiconductor regions.

5. The silicon carbide semiconductor device according to claim 4, wherein the sixth semiconductor regions have an impurity concentration higher than the impurity concentration of the second semiconductor layer.

6. The silicon carbide semiconductor device according to claim 4, further comprising a plurality of seventh semiconductor regions of the second conductivity type, provided in the sixth semiconductor regions, in regions thereof free of the third semiconductor regions.

7. The silicon carbide semiconductor device according to claim 1, wherein in the first semiconductor regions, regions free of the high-impurity-concentration regions each have a width equal to a thickness of the first semiconductor regions.

8. The silicon carbide semiconductor device according to claim 1, wherein the gate electrodes of the first semiconductor areas have a potential equal to a potential of the gate electrodes of the second semiconductor areas.

* * * * *